(12) United States Patent
Kashiyama

(10) Patent No.: US 10,824,074 B2
(45) Date of Patent: Nov. 3, 2020

(54) LIQUID PROCESSING APPARATUS AND LIQUID PROCESSING METHOD

(71) Applicant: SCREEN HOLDINGS CO., LTD., Kyoto (JP)

(72) Inventor: Masahito Kashiyama, Kyoto (JP)

(73) Assignee: SCREEN Holdings Co., Ltd. (JP)

(*) Notice: Subject to any disclaimer, the term of this patent is extended or adjusted under 35 U.S.C. 154(b) by 0 days.

(21) Appl. No.: 16/780,943

(22) Filed: Feb. 4, 2020

(65) Prior Publication Data

US 2020/0264512 A1    Aug. 20, 2020

(30) Foreign Application Priority Data

Feb. 15, 2019    (JP) .................. 2019-025659

(51) Int. Cl.
    *G03F 7/16*    (2006.01)

(52) U.S. Cl.
    CPC ...................... *G03F 7/16* (2013.01)

(58) Field of Classification Search
    CPC .......................................... G03F 7/16
    USPC ........................................... 355/27
    See application file for complete search history.

(56) References Cited

U.S. PATENT DOCUMENTS

| | | | |
|---|---|---|---|
| 5,962,070 A | 10/1999 | Mitsuhashi et al. | 427/240 |
| 2009/0130614 A1 | 5/2009 | Ookouchi et al. | 430/434 |
| 2010/0330508 A1 | 12/2010 | Ookouchi et al. | 430/423 |
| 2016/0240413 A1* | 8/2016 | Kobayashi | H01L 21/67028 |
| 2016/0372340 A1* | 12/2016 | Takeaki | H01L 21/6708 |
| 2018/0061678 A1* | 3/2018 | Miura | H01L 21/67034 |
| 2019/0096706 A1* | 3/2019 | Kai | H01L 21/67051 |
| 2019/0148192 A1* | 5/2019 | Yamaguchi | H01L 22/20 |

FOREIGN PATENT DOCUMENTS

| | | |
|---|---|---|
| JP | 11-111603 A | 4/1999 |
| JP | 2009-231617 A | 10/2009 |
| JP | 2009-231618 A | 10/2009 |
| JP | 4369325 B2 | 11/2009 |
| JP | 5317504 B2 | 10/2013 |
| JP | 5323374 B2 | 10/2013 |

\* cited by examiner

*Primary Examiner* — Hung Nguyen
(74) *Attorney, Agent, or Firm* — Ostrolenk Faber LLP

(57) ABSTRACT

A development liquid is discharged from a development liquid nozzle having one discharge port extending continuously in one direction to the substrate. The development liquid nozzle is fixed such that the development liquid is supplied to a reference straight line on an upper surface of the substrate, and is fixed such that a liquid receiving region that receives the development liquid on the upper surface of the substrate extends in a direction inclined with respect to the reference straight line, the reference straight line passing through a rotational center of the substrate. The development liquid nozzle is moved in a direction of the reference straight line. The liquid receiving region has one end and another end. The other end is located farther away from the rotational center of the substrate than the one end, and is located farther downstream in the rotation direction of the substrate than the one end.

14 Claims, 8 Drawing Sheets

LIQUID PROCESSING APPARATUS AND LIQUID PROCESSING METHOD

BACKGROUND OF THE INVENTION

Field of the Invention

The present invention relates to a liquid processing apparatus and a liquid processing method for performing predetermined processing by supplying liquid to a substrate.

Description of Related Art

Conventionally, a development device is used in order to perform development processing on a resist film formed on a substrate. For example, the development device includes a spin chuck that holds the substrate horizontally and rotates the substrate about a vertical axis, and a nozzle that supplies a development liquid to the substrate. During the development processing, the nozzle moves from a position outside of the substrate to a position above the center of the substrate while discharging the development liquid with the substrate rotated by the spin chuck (see JP 4369325 B2, for example).

In this case, the development liquid is supplied to the entire substrate, and a liquid layer of the development liquid is formed to cover the resist film on the substrate. In this state, the dissolution reaction of the resist film on the substrate proceeds. Thereafter, the development liquid and the dissolved resist on the substrate are removed, and the development processing ends.

BRIEF SUMMARY OF THE INVENTION

As described above, in the processing of supplying a processing liquid such as the development liquid onto the entire substrate, it is required to reduce more the amount of the processing liquid to be used, so that the manufacturing cost of a substrate is reduced. Further, it is desired that the processing is performed efficiently in a shorter period of time.

An object of the present invention is to provide a liquid processing apparatus and a liquid processing method for enabling reduction of an amount of a processing liquid to be used and improvement of efficiency of substrate processing.

(1) A liquid processing apparatus according to one aspect of the present invention that performs predetermined processing by supplying a processing liquid to a substrate includes a rotation holder that holds the substrate in a horizontal attitude and rotates the substrate about a vertical axis, a nozzle that has one discharge port extending continuously in one direction or a plurality of discharge ports intermittently arranged in the one direction and discharges a processing liquid to an upper surface of the substrate rotated by the rotation holder, a processing liquid supply system that supplies the processing liquid to the nozzle, and a mover that moves the nozzle in a direction of a straight line with part of the processing liquid discharged from the nozzle being supplied onto the straight line on the upper surface of the substrate and with a liquid receiving region that receives the processing liquid on the upper surface of the substrate extending in a direction inclined with respect to the straight line, the straight line passing through a rotational center of the substrate rotated by the rotation holder, and the liquid receiving region has first and second ends, and the second end is located farther away from the rotational center of the substrate than the first end, and is located farther downstream than the first end in a rotation direction of the substrate.

In the liquid processing apparatus, the nozzle is moved in the direction of the straight line with part of the processing liquid discharged from the nozzle being supplied onto the straight line on the upper surface of the substrate and with the liquid receiving region extending in the direction inclined with respect to the straight line, the straight line passing through the rotational center of the substrate. The second end of the liquid receiving region is located farther downstream than the first end. In this case, the processing liquid supplied to the upper surface of the substrate spreads quickly over a wide range on the upper surface of the substrate from the liquid receiving region. Therefore, the nozzle moves in the direction of the straight line, so that the film of the processing liquid is uniformly formed on the entire upper surface of the substrate in a short period of time. Therefore, the processing liquid required for processing the substrate can be reduced, and the period of time required for processing the substrate is shortened. Thus, efficiency of substrate processing is improved.

(2) The mover may move the nozzle with the one discharge port or the plurality of discharge ports being spaced apart from the straight line in a plan view and with the processing liquid being discharged downstream in the rotation direction of the substrate from the one discharge port or plurality of discharge ports.

In this case, the processing liquid is supplied obliquely from above to the upper surface of the substrate. At this time, the direction in which the processing liquid is supplied to the liquid receiving region and the rotation direction of the substrate substantially coincide with each other in a plan view. Thus, the processing liquid spreads smoothly and downstream of the liquid receiving region from the liquid receiving region on the upper surface of the substrate. Further, even in a case where part of the processing liquid supplied to the liquid receiving region is splashed upward of the substrate, the splashing droplets are scattered downstream in the rotation direction of the substrate, that is, the direction away from the nozzle. Therefore, the splashing droplets of the processing liquid on the upper surface of the substrate are prevented from adhering to the nozzle, and generation of particles due to contamination of the nozzle is prevented.

(3) The nozzle may have the one discharge port, and the one discharge port may be a slit formed to extend continuously in the one direction.

In this case, the processing liquid smoothly spreads downstream of the liquid receiving region from the strip-shaped liquid receiving region formed on the upper surface of the substrate.

(4) The mover may move the nozzle such that the liquid receiving region moves from the rotational center of the substrate to an outer peripheral end of the substrate.

In this case, the development liquid is supplied continuously from the rotational center of the substrate to the outer peripheral end of the substrate. Thus, the processing liquid can be uniformly supplied to the entire upper surface of the substrate.

(5) The mover may move the nozzle such that the liquid receiving region moves to the outer peripheral end of the substrate, and then may move the nozzle such that the liquid receiving region returns to the rotational center of the substrate from the outer peripheral end of the substrate.

In this case, the processing liquid is supplied continuously to the outer peripheral end of the substrate from the rotational center of the substrate, whereby the processing liquid is supplied to the entire upper surface of the substrate, and the upper surface of the substrate becomes sufficiently moistened. Thus, the processing liquid is supplied continuously from the outer peripheral end of the substrate to the rotational center of the substrate, whereby the liquid layer of the processing liquid can be stably formed on the upper surface of the substrate.

(6) The mover, when movement of the nozzle is started, may position the nozzle such that the first end of the liquid receiving region is located at the rotational center of the substrate.

In this case, the supply of the processing liquid to the substrate is started, and the processing liquid can be smoothly supplied from the center of the substrate towards the outer peripheral end of the substrate.

(7) A liquid processing method according to another aspect of the present invention for performing predetermined processing by supplying a processing liquid to a substrate includes holding the substrate in a horizontal attitude and rotating the substrate about a vertical axis, supplying the processing liquid to a nozzle having one discharge port extending continuously in one direction or a plurality of discharge ports arranged intermittently in the one direction and discharging the processing liquid from the nozzle to an upper surface of the rotating substrate, and moving the nozzle in a direction of a straight line with part of the processing liquid discharged from the nozzle being supplied onto the straight line on the upper surface of the substrate and with a liquid receiving region that receives the processing liquid on the upper surface of the substrate extending in a direction inclined with respect to the straight line, the straight line passing through a rotational center of the rotating substrate, wherein the liquid receiving region has first and second ends, and the second end is located farther away from the rotational center of the substrate than the first end and is located farther downstream than the first end in a rotation direction of the substrate.

With this liquid processing method, the nozzle is moved in the direction of the straight line with part of the processing liquid discharged from the nozzle being supplied onto the straight line on the upper surface of the substrate and with the liquid receiving region extending in the direction inclined with respect to the straight line, the straight line passing through the rotational center of the substrate. The second end of the liquid receiving region is located farther downstream than the first end. In this case, the processing liquid supplied to the upper surface of the substrate spreads quickly over a wide range on the upper surface of the substrate from the liquid receiving region. Therefore, the nozzle is moved in the direction of the straight line, so that the film of the processing liquid is formed uniformly on the entire upper surface of the substrate in a short period of time. Therefore, the processing liquid required for processing the substrate can be reduced, and the period of time required for processing the substrate is shortened. Thus, the efficiency of the substrate processing is improved.

(8) The moving the nozzle in the direction of the straight line may include moving with the one discharge port or the plurality of discharge ports being spaced apart from the straight line in a plan view and with the processing liquid being discharged downstream in the rotation direction of the substrate from the one discharge port or the plurality of discharge ports.

In this case, the processing liquid is supplied obliquely from above to the upper surface of the substrate. At this time, the direction in which the processing liquid is supplied to the liquid receiving region and the rotation direction of the substrate substantially coincide with each other in a plan view. Thus, the processing liquid spreads smoothly and downstream of the liquid receiving region from the liquid receiving region on the upper surface of the substrate. Further, even in a case where part of the processing liquid supplied to the liquid receiving region is splashed upward of the substrate, the splashing droplets are scattered downstream in the rotation direction of the substrate, that is, the direction away from the nozzle. Therefore, the splashing droplets of the processing liquid on the upper surface of the substrate are prevented from adhering to the nozzle, and generation of particles due to contamination of the nozzle is prevented.

(9) The nozzle may have the one discharge port, and the one discharge port may be a slit formed to extend continuously in the one direction.

In this case, the processing liquid spreads smoothly and downstream of the liquid receiving region from the strip-shaped liquid receiving region formed on the upper surface of the substrate.

(10) The moving the nozzle in the direction of the straight line may include moving the nozzle such that the liquid receiving region moves from the rotational center of the substrate to an outer peripheral end of the substrate.

In this case, the development liquid is supplied continuously to the outer peripheral end of the substrate from the rotation center of the substrate. Thus, the processing liquid can be uniformly supplied to the entire upper surface of the substrate.

(11) The moving the nozzle in the direction of the straight line may include moving the nozzle such that the liquid receiving region moves to the outer peripheral end of the substrate, and then moving the nozzle such that the liquid receiving region returns to the rotational center of the substrate from the outer peripheral end of the substrate.

In this case, the processing liquid is supplied continuously to the outer peripheral end of the substrate from the rotational center of the substrate. Thus, the processing liquid is supplied to the entire upper surface of the substrate, and the upper surface of the substrate becomes sufficiently moistened. Therefore, the processing liquid is supplied continuously to the rotational center of the substrate from the outer peripheral end of the substrate, whereby the liquid layer of the processing liquid can be formed on the upper surface of the substrate.

(12) The moving the nozzle in a direction of a straight line, when movement of the nozzle is started, may include positioning the nozzle such that the first end of the liquid receiving region is located at the rotational center of the substrate.

In this case, the supply of the processing liquid to the substrate is started, and the processing liquid can be smoothly supplied from the center of the substrate to the outer peripheral end of the substrate.

Other features, elements, characteristics, and advantages of the present invention will become more apparent from the following description of preferred embodiments of the present invention with reference to the attached drawings.

DESCRIPTION OF THE PREFERRED EMBODIMENTS

A liquid processing apparatus and a liquid processing method according to one embodiment of the present invention will be described below with reference to drawings. In the following description, a substrate refers to a semiconductor substrate, a substrate for an FPD (Flat Panel Display) such as a liquid crystal display device or an organic EL (Electro Luminescence) display device, a substrate for an optical disc, a substrate for a magnetic disc, a substrate for a magneto-optical disc, a substrate for a photomask, a ceramic substrate, a substrate for a solar battery, or the like.

[1] Basic Configuration of Liquid Processing Apparatus

Figure 1:
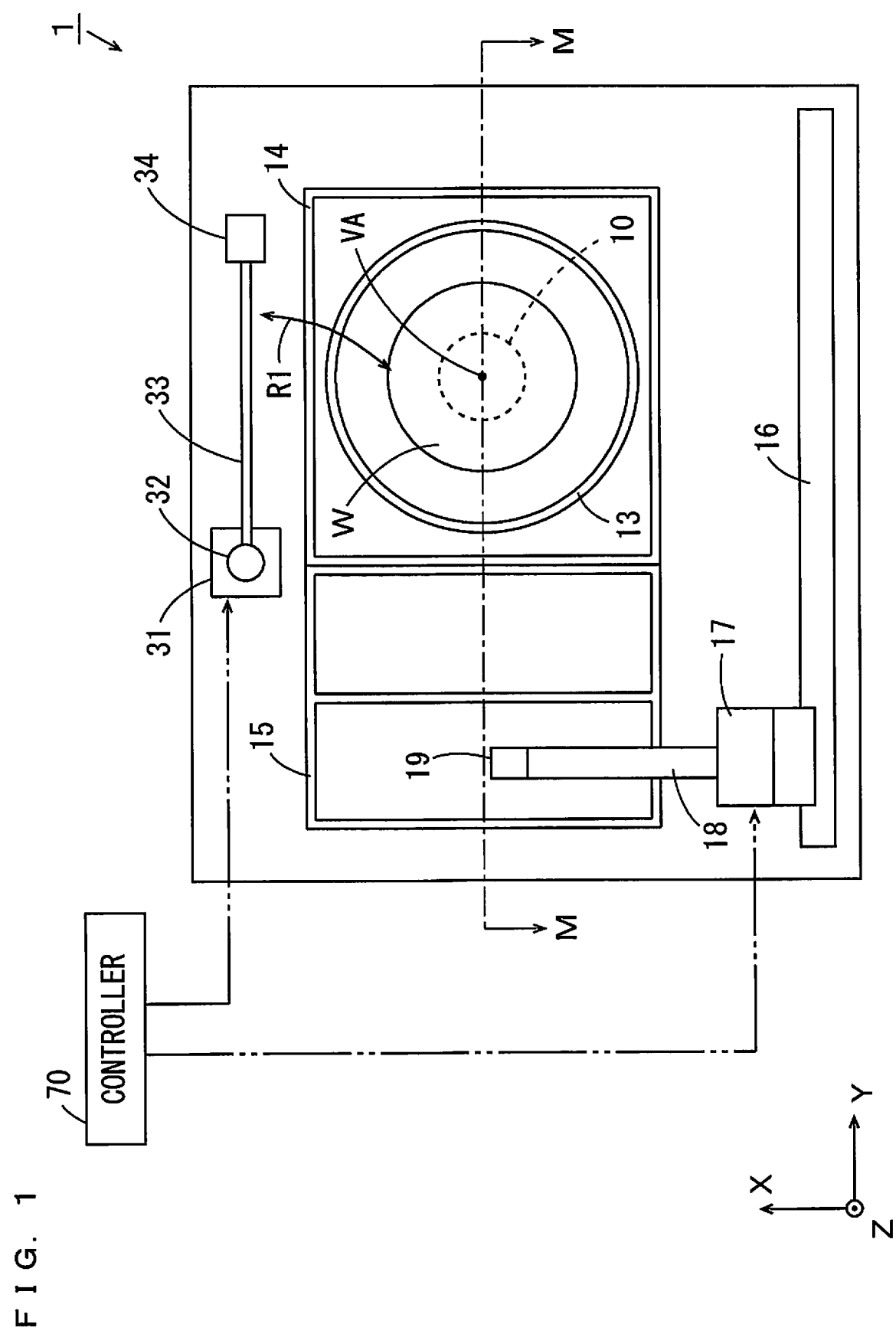
FIG. 1 is a schematic plan view showing the configuration of a development device according to one embodiment of the present invention.

A development device (a developer) will be described as one example of the liquid processing apparatus. FIG. 1 is a schematic plan view showing the configuration of the development device according to one embodiment of the present invention, and FIG. 2 is a schematic cross sectional view taken along the M-M line of the development device 1 of FIG. 1.

Figure 2:
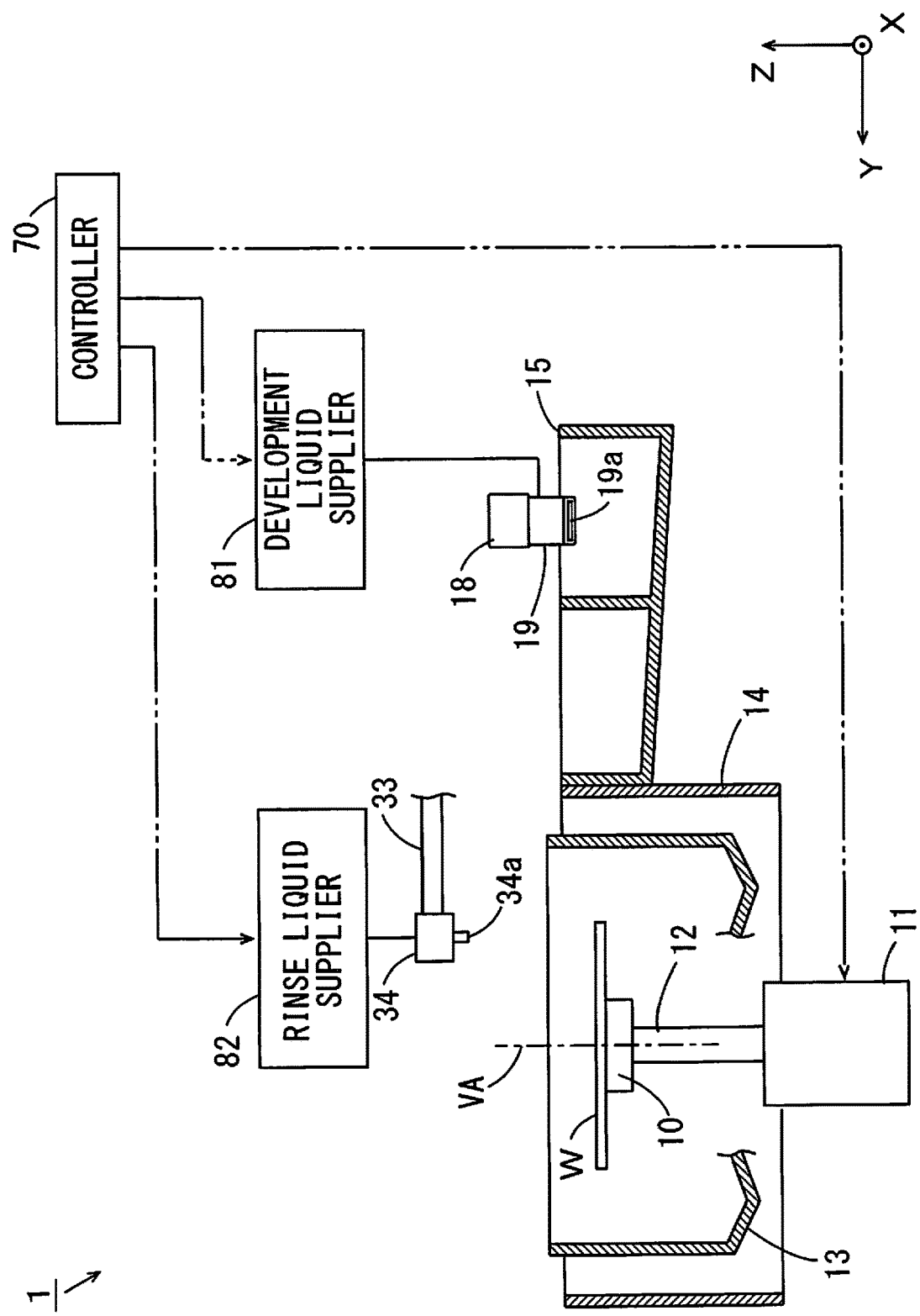
FIG. 2 is a schematic cross sectional view taken along the line M-M of the development device of FIG. 1.

In the development device 1 shown in FIGS. 1 and 2, two directions that are orthogonal to each other within a horizontal plane are defined as an X direction and a Y direction, and a vertical direction is defined as a Z direction. The X direction means the direction of an arrow X of FIG. 1 or the direction opposite to the direction of the arrow X, the Y direction means the direction of an arrow Y of FIG. 1 or the direction opposite to the direction of the arrow Y, and the Z direction means the direction of an arrow Z of FIG. 1 or the direction opposite to the direction of the arrow Y.

As shown in FIG. 1, the development device 1 includes a spin chuck 10 that holds the substrate W by suction in a horizontal attitude. The spin chuck 10 is fixed to a tip of a rotation shaft 12 of a motor 11 (FIG. 2), and is configured to be rotatable about an axis (an axial center of the rotation shaft 12) VA extending in the Z direction. A circular inner cup 13 is provided around the spin chuck 10 to be movable in the Z direction and surround the substrate W. Further, a rectangular outer cup 14 is provided to surround the inner cup 13.

A waiting pod 15 is provided on one side of the outer cup 14 in the Y direction. A guide rail 16 extending in the Y direction is provided to be adjacent to the outer cup 14 and the waiting pod 15 in the X direction.

A first driver 17 is provided at the guide rail 16 to be movable in the Y direction along the guide rail 16. A first arm 18 is attached to the first driver 17. The first arm 18 extends in the X direction from the first driver 17. Further, the first arm 18 is driven by the first driver 17, is movable in the Y direction along the guide rail 16 and is movable in the Z direction. A development liquid nozzle 19 is provided at the tip of the first arm 18.

In the present embodiment, an orientation of the development liquid nozzle 19 with respect to the substrate W rotated by the spin chuck 10 is fixed by the guide rail 16, the first driver 17 and the first arm 18. Further, the development liquid nozzle 19 is positioned and moved with respect to the substrate W rotated by the spin chuck 10 by the guide rail 16, the first driver 17 and the first arm 18.

A second driver 31 is arranged such that the guide rail 16, the spin chuck 10 and the second driver 31 are aligned in this order in the X direction. A support shaft 32 extending in the Z direction is attached to the second driver 31. A second arm 33 is attached to the support shaft 32. The second arm 33 extends in a horizontal direction from the support shaft 32. The support shaft 32 is driven by the second driver 31, rotatable about its axial center and movable in the Z direction. When the support shaft 32 is rotated, the second arm 33 is rotated about the support shaft 32 in the direction of an arrow R1 of FIG. 1. When the support shaft 32 is lifted, the second arm 33 is lifted together with the support shaft 32. When the support shaft 32 is lowered, the second arm 33 is lowered together with the support shaft 32. A rinse liquid nozzle 34 is provided at the tip of the second arm 33.

As shown in FIG. 2, the development device 1 further includes a development liquid supplier 81 and a rinse liquid supplier 82. In FIG. 2, the rinse liquid nozzle 34 and part of the second arm 33 of FIG. 1 are shown for explaining the rinse liquid supplier 82.

The development liquid supplier 81 includes one or a plurality of fluid-related elements such as a conduit, a coupler, a valve, a pump and a tank, and is connected to a development liquid supply source (not shown). A pipe extending from the development liquid supplier 81 is connected to the development liquid nozzle 19. The development liquid supplier 81 supplies a development liquid to the development liquid nozzle 19 based on the control of a controller 70, described below. Thus, the development liquid is discharged from a discharge port 19a of the development liquid nozzle 19.

Similarly to the development liquid supplier 81, the rinse liquid supplier 82 includes one or a plurality of fluid-related elements and is connected to a rinse liquid supply source (not shown). A pipe extending from the rinse liquid supplier 82 is connected to the rinse liquid nozzle 34. The rinse liquid supplier 82 supplies a rinse liquid to the rinse liquid nozzle 34 based on the control of the controller 70, described below. Thus, the rinse liquid is discharged from a discharge port 34a of the rinse liquid nozzle 34.

As shown in FIGS. 1 and 2, the development device 1 includes the controller 70. The controller 70 includes a CPU (Central Processing Unit) and a memory, or a microcomputer, for example, and controls the operations of the first driver 17, the second driver 31, the motor 11, the development liquid supplier 81 and the rinse liquid supplier 82 as indicated by two-dots and dash arrows in FIGS. 1 and 2.

The control of the controller 70 causes the development liquid nozzle 19 to move to a position above the rotating substrate W with the substrate being held by suction and rotated by the spin chuck 10. Subsequently, the development liquid nozzle 19 is moved above the substrate W while the development liquid is discharged to the substrate W from the development liquid nozzle 19 (development processing). Next, the discharge of the development liquid is stopped, and the development liquid nozzle 19 is moved to a position (the waiting pod 15) spaced apart from the substrate W in the Y direction. A specific example of the development processing will be described below.

Thereafter, the rinse liquid nozzle 34 is moved to a position above the rotating substrate W. Then, the rinse liquid is discharged to the substrate W from the rinse liquid nozzle 34 (cleaning processing). Thus, the development liquid that has been supplied onto the substrate W is cleaned away by the rinse liquid. Next, the discharge of the rinse liquid is stopped, and the rinse liquid nozzle 34 is moved to a position (a position outside of the substrate W) spaced apart from the substrate W in the X direction. Finally, the substrate W is rotated at a high speed, whereby the rinse liquid adhering to the substrate W is shaken off, and the substrate W is dried.

[2] Configuration of Development Liquid Nozzle 19

Figure 3:
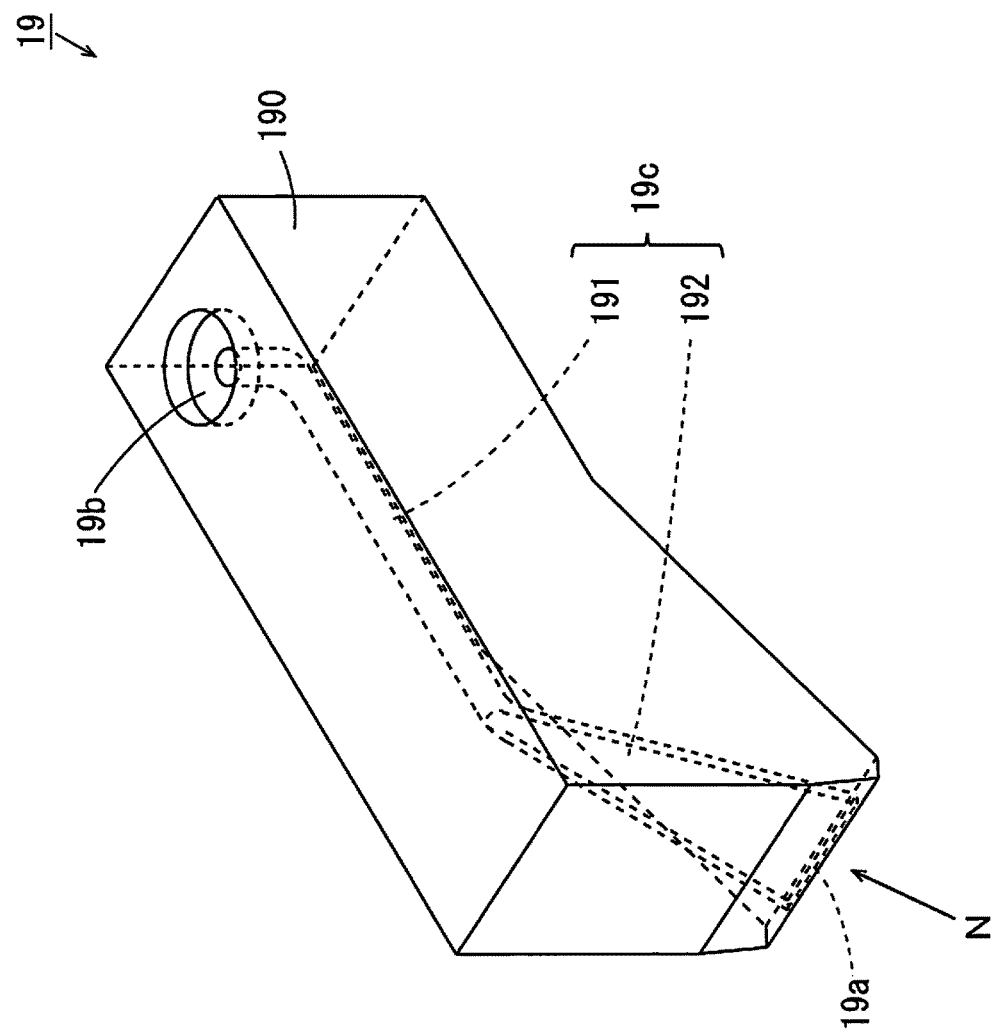
FIG. 3 is an external perspective view of a development liquid nozzle of FIG. 1.

Here, the configuration of the development liquid nozzle 19 of FIG. 1 will be described. FIG. 3 is an external perspective view of the development liquid nozzle 19 of FIG. 1. As shown in FIG. 3, the development liquid nozzle 19 of the present example has the structure in which the discharge port 19a, a liquid inlet port 19b and a flow path 19c are formed in a base member 190 having a predetermined shape. The base member 190 may be an integrally formed product made of a single material, or may be fabricated by a combination of a plurality of components, for example.

The discharge port 19a is a slit extending continuously in one direction. The dimension of the discharge port 19a will be described below. The liquid inlet port 19b is formed such that a pipe extending from the development liquid supplier 81 of FIG. 2 can be connected to the liquid inlet port 19b. The flow path 19c is formed to connect the discharge port 19a to the liquid inlet port 19b inside of the base member 190 and includes a first flow path 191 and a second flow path 192.

The first flow path 191 has a substantially constant cross sectional shape, and is formed to extend inside of the base member 190 by a predetermined distance from the liquid inlet port 19b. In the present embodiment, the cross section of the first flow path 191 is circular or square, for example.

The cross sectional shape of the second flow path 192 changes continuously from one end (an upstream end) to the other end (a downstream end). Specifically, the second flow path 192 is formed such that the closer a portion in the first flow path 191 is to the discharge port 19a, the continuously larger the size of the cross section of the portion in one direction is. While the cross section at the one end of the second flow path 192 is circular or square, the cross section at the other end of the second flow path 192 is slit-like.

Figure 4:
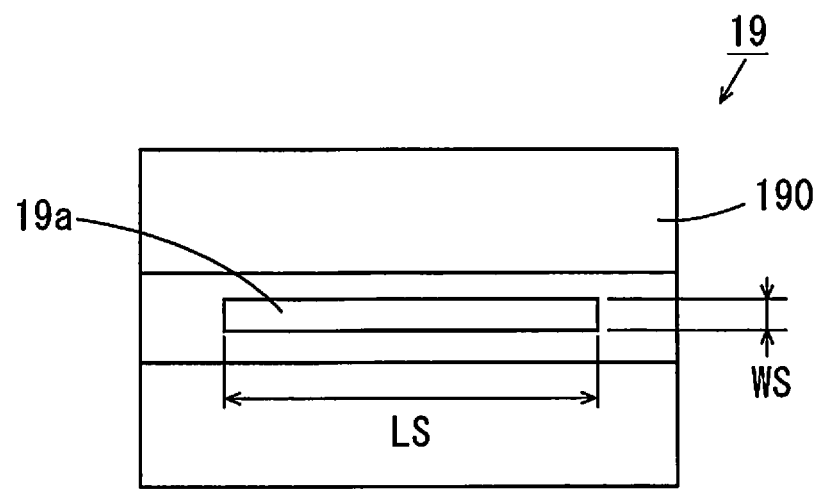
FIG. 4 is an enlarged view of a discharge port of the development liquid nozzle as viewed in the direction of an arrow N of FIG. 3.

FIG. 4 is an enlarged view of the discharge port 19a of the development liquid nozzle 19 as viewed in the direction of an arrow N of FIG. 3. In the present embodiment, a length LS of the discharge port 19a of the development liquid nozzle 19 in a longitudinal direction is not less than 10 mm and not more than 15 mm, and is 12 mm, for example. Further, a width WS of the discharge port 19a is not less than 0.2 mm and not more than 0.4 mm, and is 0.2 mm or 0.3 mm, for example.

Figure 5:
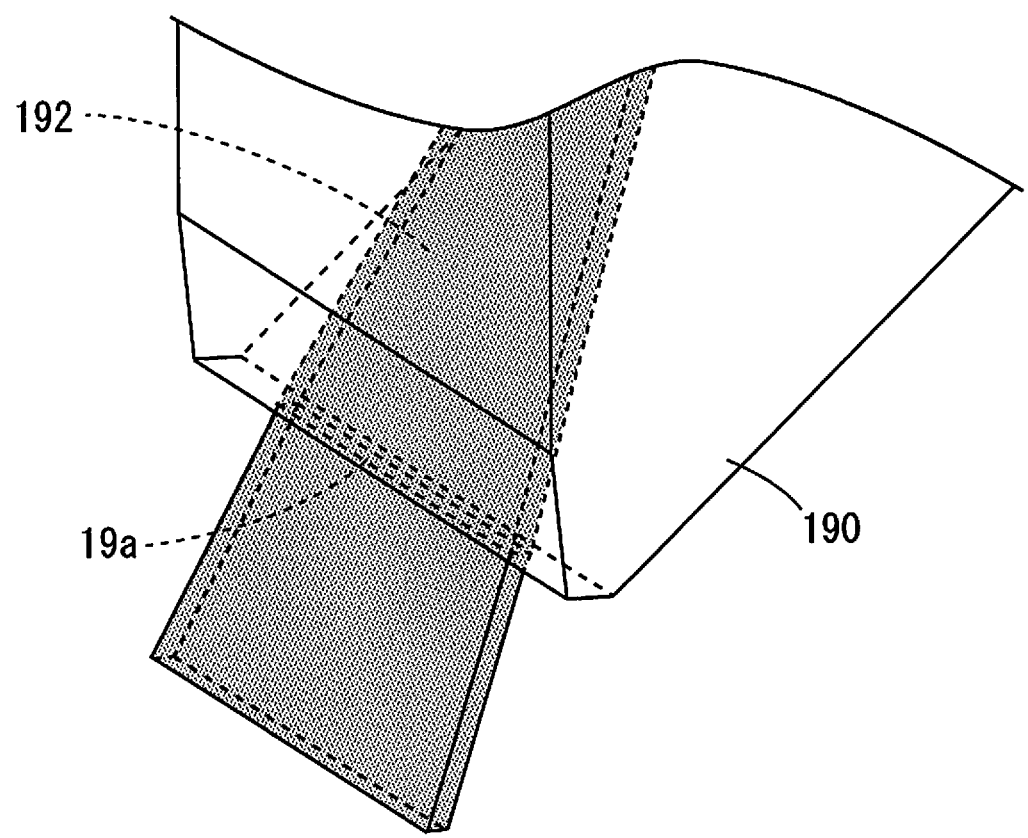
FIG. 5 is a partially enlarged view of the development liquid nozzle showing the development liquid being discharged from the discharge port of FIG. 4.

FIG. 5 is a partially enlarged view of the development liquid nozzle 19 with the development liquid being discharged from the discharge port 19a of FIG. 4. In FIG. 5, the appearance of the discharge port 19a and its peripheral portions of the development liquid nozzle 19 are shown, and the state of the development liquid being discharged from the discharge port 19a through the inside of the development liquid nozzle 19 is indicated by a dotted pattern. As shown in FIG. 5, the development liquid discharged from the slit-like discharge port 19a has a strip-shape cross section extending continuously in the longitudinal direction of the discharge port 19a.

[3] Specific Example of Development Processing

Figure 6:
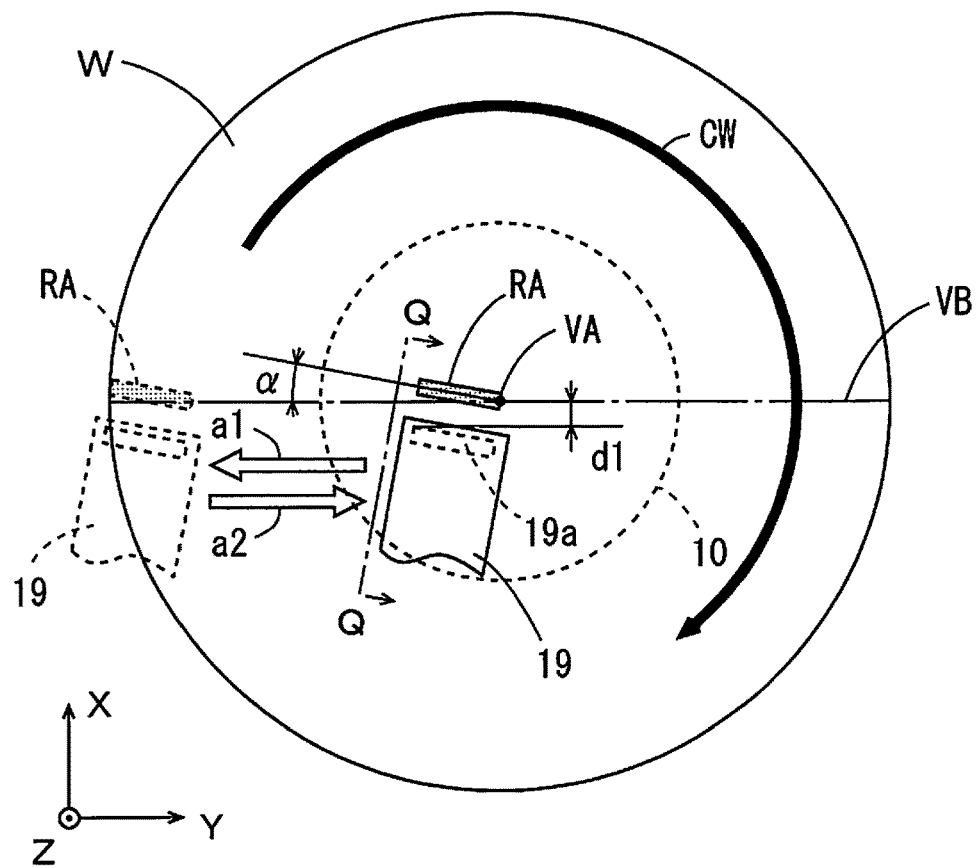
FIGS. 6 and 7 are diagrams for explaining a specific example of development processing using the development device of FIG. 1.
Figure 7:
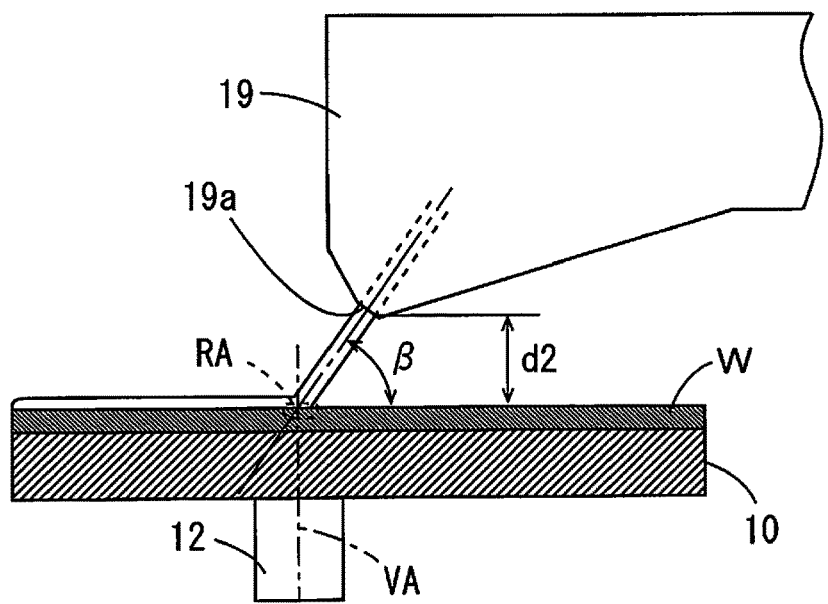

FIGS. 6 and 7 are diagrams for explaining a specific example of the development processing using the development device 1 of FIG. 1. The states of the substrate W and the development liquid nozzle 19 during the development processing are shown in a plan view in FIG. 6. A cross sectional view taken along the line Q-Q of FIG. 6 is shown in FIG. 7. In FIG. 6, the development liquid being discharged from the development liquid nozzle 19 to the substrate W is not shown. During the development processing of the present example, the substrate W is rotated in a clockwise direction in a plan view. In FIG. 6, the rotation direction of the substrate W is indicated by a thick solid arrow CW.

Here, a virtual straight line extending on an upper surface of the substrate W through a rotational center (the center of the substrate W in the present example) of the substrate W with the substrate W rotated and held by suction in a horizontal attitude is defined as a reference straight line VB. In the present example, the reference straight line VB extends in parallel to the Y direction. Further, in the present example, the substrate W on which the development processing is to be performed is held by suction by the spin chuck 10 such that its center is located on an axis VA of FIG. 1. In this case, the length of the reference straight line VB is the diameter of the substrate W.

In the following description, a region that receives the development liquid on the upper surface of the substrate W when the development liquid is discharged from the development liquid nozzle 19 to the substrate W is referred to as a liquid receiving region. The liquid receiving region extends continuously in one direction according to the shape of the discharge port 19a. Thus, the liquid receiving region of the present example has a strip shape.

In the development device 1 according to the present embodiment, when the development processing is performed, the orientation of the development liquid nozzle 19 with respect to the substrate W is fixed such that the development liquid discharged from the development liquid nozzle 19 is supplied onto the reference straight line VB. Further, as shown in FIG. 6, the orientation of the development liquid nozzle 19 with respect to the substrate W is fixed such that the liquid receiving region RA extends in the direction inclined with respect to the reference straight line VB. Here, the liquid receiving region RA is formed such that, with another end of the liquid receiving region RA being located farther away from the rotational center of the substrate W than one end of the liquid receiving region RA, the other end is located farther downstream than the one end in the rotation direction of the substrate. The angle (hereinafter referred to as a nozzle angle) α between the straight line in parallel to the direction in which the liquid receiving region RA extends and the reference straight line VB is larger than 0° and smaller than 45°.

Further, when the development processing is performed, the orientation of the development liquid nozzle 19 is fixed such that a traveling direction (hereinafter referred to as a discharge direction) of the development liquid discharged from the discharge port 19a is inclined with respect to the upper surface of the substrate W (see FIG. 7). The angle β (hereinafter referred to as a discharge angle) between the straight line in parallel to the discharge direction and the upper surface of the substrate W is set to not less than 30° and not more than 60°, and is preferably set to 45°. Further, when the development processing is performed, the orientation of the development liquid nozzle 19 is fixed such that the distance d2 from the lower end of the discharge port 19a to the upper surface of the substrate W is not less than 5 mm and not more than 7 mm, and is preferably 6 mm. In this case, as shown in FIG. 6, the discharge port 19a of the development liquid nozzle 19 is spaced apart from the reference straight line VB in a plan view. The distance d1 between the discharge port 19a and the reference straight line VB is not less than 5 mm and not more than 6 mm in a plan view, for example.

When the development processing is started, the development liquid nozzle 19 is positioned such that the one end of the liquid receiving region RA is located at the rotational center of the substrate W with the orientation of the development liquid nozzle 19 specifically fixed with respect to the substrate W, as described above. Further, the development liquid is supplied onto the rotating substrate W. Thus, as shown in FIG. 7, the development liquid discharged from the development liquid nozzle 19 is received in the liquid receiving region RA, travels downstream in the rotation direction of the substrate W and flows on the substrate W to spread towards the outer peripheral end of the substrate W.

Next, as indicated by an outlined arrow a1 in FIG. 6, the development liquid nozzle 19 is moved at a predetermined speed (about 100 mm/sec, for example) in the direction of the reference straight line VB towards the outer peripheral end of the substrate W. During this movement, the orientation of the development liquid nozzle 19 is maintained the same as it is when the development processing is started. In this case, the development liquid is supplied continuously to the outer peripheral end of the substrate W from the rotational center of the substrate W. Thus, the development liquid is supplied uniformly to the entire upper surface of the substrate W.

Next, when the other end of the liquid receiving region RA reaches the outer peripheral end of the substrate W, the development liquid nozzle 19 is moved at a predetermined speed (about 100 mm/sec, for example) in parallel to the reference straight line VB towards the center of the substrate W as indicated by an outlined arrow a2 in FIG. 6. Also during this movement, the orientation of the development liquid nozzle 19 is maintained the same as it is when the development processing is started.

In this case, because the entire upper surface of the substrate W is sufficiently moistened in advance, it is possible to form a liquid layer of the development liquid stably on the upper surface of the substrate W by supplying the development liquid continuously to the rotational center of the substrate W from the outer peripheral end of the substrate W.

Thereafter, when the one end of the liquid receiving region RA arrives at the rotational center of the substrate W, the supply of the development liquid from the development liquid nozzle 19 to the substrate W is stopped, and the cleaning processing is performed.

In the development processing according to the present embodiment, the diameter of the substrate W to be processed is 300 mm, and the flow rate of the development liquid supplied from the development liquid nozzle 19 to the substrate W is set to about 400 ml/min, for example. Further, the rotation speed of the substrate W rotated by the spin chuck 10 is set to about 1200 rpm, for example.

[4] Simulation in Regards to Development Processing of FIGS. 6 and 7

In the following description, the period of time from the time when discharge of the development liquid is started until the time when the development liquid covers the entire upper surface of the substrate W in the development processing is referred to as a covering period of time. The inventor of the present invention examined the relationship between the nozzle angle α and the covering period of time by carrying out simulations according to first to third inventive examples and a comparative example while the nozzle angle α of FIG. 6 is set to a plurality of values.

In the simulations according to the first, second and third inventive examples, the covering periods of time required in cases where the development processing was performed under a common condition except for the nozzle angle α being set to 3°, 7° and 10° were found. In the simulation according to the comparative example, the covering period of time required in a case where the development processing was performed under the same condition as the condition for the simulations according to the first to third inventive examples except for the nozzle angle α being set to 0°.

In the simulations according to the first to third inventive examples and the comparative example, the discharge angle β was set to 45° as the common condition, and the rotation speed of the substrate W rotated by the spin chuck 10 was set to 1200 rpm. Further, the flow rate of the development liquid supplied from the development liquid nozzle 19 to the substrate W was set to 400 ml/min, and the movement speed of the development liquid nozzle 19 was set to 100 mm/sec. Further, the development liquid nozzle 19 was to start moving after 0.15 sec has elapsed from the time when discharge of the development liquid was started.

The covering period of time acquired by the simulations according to the first, second and third inventive examples were 0.582 sec, 0.582 sec and 0.608 sec, respectively. On the other hand, the covering period of time acquired by the simulation according to the comparative example was 0.632 sec.

According to the above-mentioned results of the simulations, in a case where the nozzle angle α is larger than 0° and not more than 10°, the covering period of time is short as compared to a case where the nozzle angle α is 0°. The shortness of the covering period of time means that the development liquid discharged from the development liquid nozzle 19 and supplied onto the substrate W spreads more uniformly on the upper surface of the substrate W. Therefore, it is found that it is possible to reduce the amount of development liquid required for the development processing and perform the development processing in a shorter period of time by setting the nozzle angle α to an angle larger than 0°.

Figure 8:
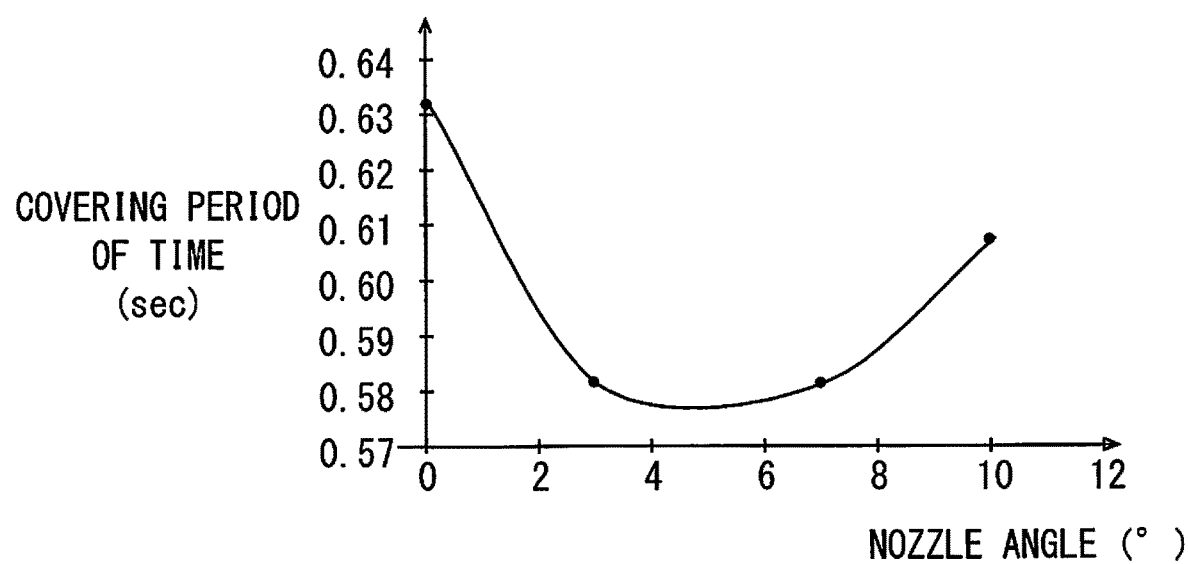
FIG. 8 is a diagram showing the results of simulations according to first to third inventive examples and a comparative example.

FIG. 8 is a diagram showing the results of simulations according to the first to third inventive examples and the comparative example. In FIG. 8, the relationship between the nozzle angle α and the covering period of time is shown in a graph. The ordinate indicates the covering period of time, and the abscissa indicates the nozzle angle α.

In the graph of FIG. 8, four points acquired from the results of simulations according to the first to third inventive examples and the comparative example are shown as the covering periods of time corresponding to the nozzle angles 0°, 3°, 7° and 10°. Further, in the graph of FIG. 8, a curve interpolating the covering periods of time corresponding to the nozzle angles 0°, 3°, 7° and 10° is shown. According to the results of simulations and the interpolation curve, it is considered that the covering period of time is extremely short in a case where the nozzle angle α is in the range of about 3° to about 7°. Thus, the nozzle angle α is preferably not less than 3° and not more than 7°.

[5] Effects (a) In the above-mentioned development device 1, during the development processing, the development liquid nozzle 19 is moved in the direction of the reference straight line VB with the development liquid discharged from the development liquid nozzle 19 being supplied onto the reference straight line VB and with the liquid receiving region RA extending in the direction inclined with respect to the reference straight line VB. The liquid receiving region RA has one end and another end. Further, the liquid receiving region RA is formed such that the other end of the liquid receiving region RA is located farther downstream than the one end of the liquid receiving region RA in the rotation direction of the substrate with the other end of the liquid receiving region RA being located farther away from the rotational center of the substrate W than the one end of the liquid receiving region RA. In this case, the development liquid supplied onto the upper surface of the substrate W during the development processing quickly spreads over a wide range on the upper surface of the substrate W from the liquid receiving region RA. Therefore, the development liquid nozzle 19 is moved in the direction of the reference straight line VB, whereby a film of the development liquid is formed uniformly on the entire upper surface of the substrate W in a short period of time. Thus, the development liquid required for processing the substrate W can be reduced, and the efficiency of the substrate processing is improved since the period of time required for the development processing of the substrate W is shortened.

(b) In the above-mentioned development device 1, the discharge direction of the development liquid discharged from the development liquid nozzle 19 is inclined with respect to the upper surface of the substrate W during the development processing. Thus, the discharge port 19a of the development liquid nozzle 19 is spaced apart from the reference straight line VB in a plan view. Further, in the above-mentioned development device 1, the development liquid is discharged downstream in the rotation direction of the substrate W from the discharge port 19a of the development liquid nozzle 19 in a plan view.

In this case, the direction in which the development liquid is supplied to the liquid receiving region RA substantially coincides with the rotation direction of the substrate W on the upper surface of the substrate W, whereby the development liquid smoothly spreads downstream of the liquid receiving region RA from the liquid receiving region RA. Further, even in a case where part of the development liquid supplied to the liquid receiving region RA is splashed upward of the substrate W, splashing droplets are scattered downstream in the rotation direction of the substrate W, that is, the direction away from the development liquid nozzle 19. Thus, the droplets of the development liquid that are splashed upward of the substrate W are prevented from adhering to the development liquid nozzle 19, and generation of particles due to contamination of the development liquid nozzle 19 is prevented.

[6] Modified Example of Development Liquid Nozzle 19

Figure 9:
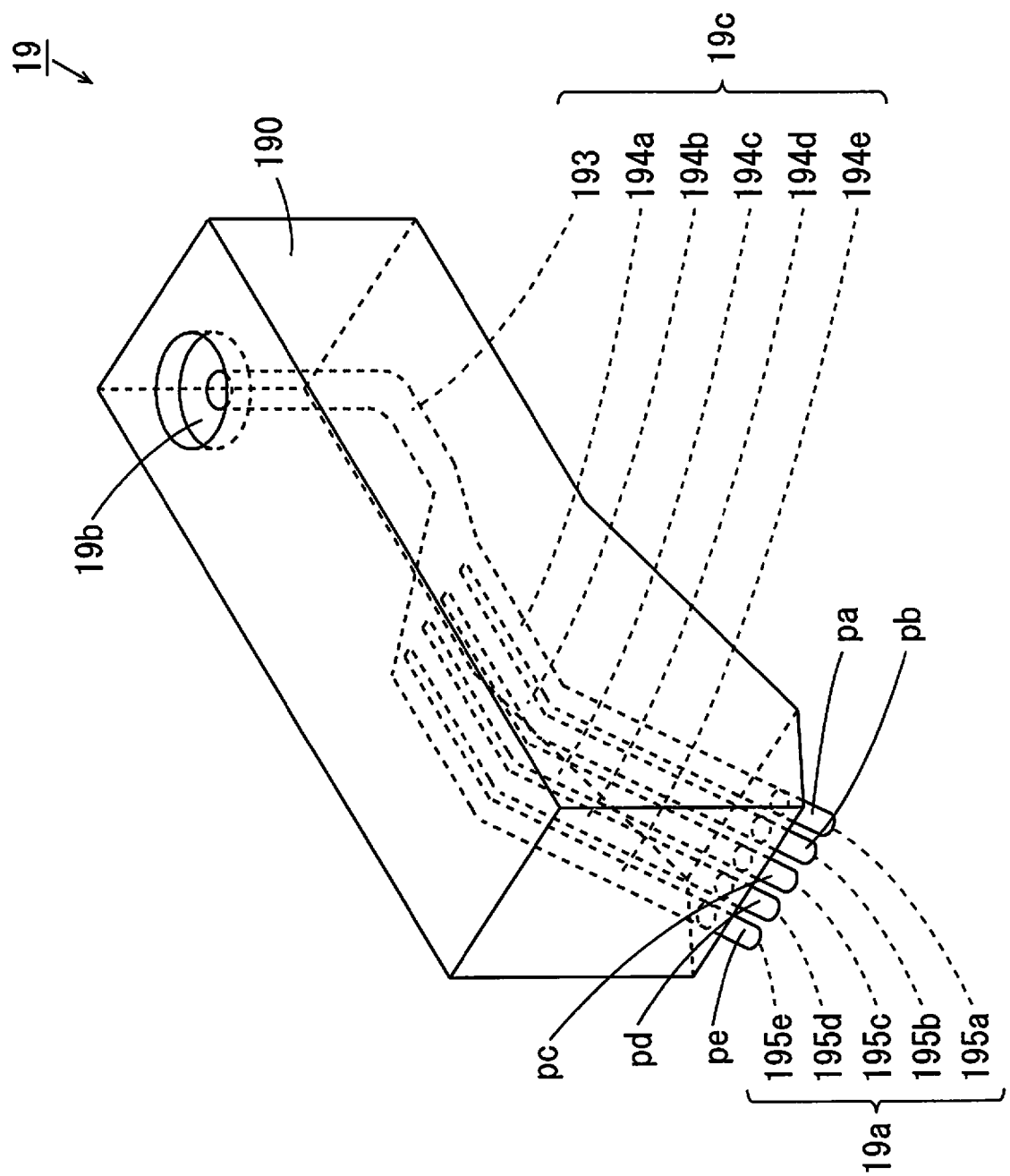
FIG. 9 is an external perspective view of a development liquid nozzle according to a modified example.

In the present embodiment, the development liquid nozzle 19 may be configured to have a plurality of discharge ports intermittently arranged in one direction. FIG. 9 is an external perspective view of the development liquid nozzle 19 according to the modified example. As for the development liquid nozzle 19 of FIG. 9, differences from the development liquid nozzle 19 of FIG. 3 will be described.

As shown in FIG. 9, in the development liquid nozzle 19 according to the modified example, the flow path 19c has a main flow path 193 and a branch flow path including a plurality (five in the present example) of sub-flow paths 194a, 194b, 194c, 194d, 194e. The upstream end of the main flow path 193 is connected to the liquid inlet port 19b, and the downstream end of the main flow path 193 is connected to the upstream ends of the sub-flow paths 194a to 194e. Further, a plurality (five in the present example) of discharge pipes pa, pb, pc, pd, pe are provided at the downstream ends of the sub-flow paths 194a, 194b, 194c, 194d, 194e. The downstream ends of the five discharge pipes pa, pb, pc, pd, pe constitute the five discharge ports 195a, 195b, 195c, 195d, 195e.

In this case, the development liquid discharged from the development liquid nozzle 19 has a cross section intermittently extending in the direction in which the five discharge ports 195a, 195b, 195c, 195d, 195e are arranged. Thus, when the development processing is performed, the liquid receiving region RA having substantially the same shape as that of the above-mentioned example is formed. Therefore, also in a case where the above-mentioned development processing is performed using the development liquid nozzle 19 according to the present modified example, it is thought that the effects similar to that of the above-mentioned example can be acquired.

[7] Substrate Processing Apparatus Including Development Device 1 of FIG. 1

Figure 10:
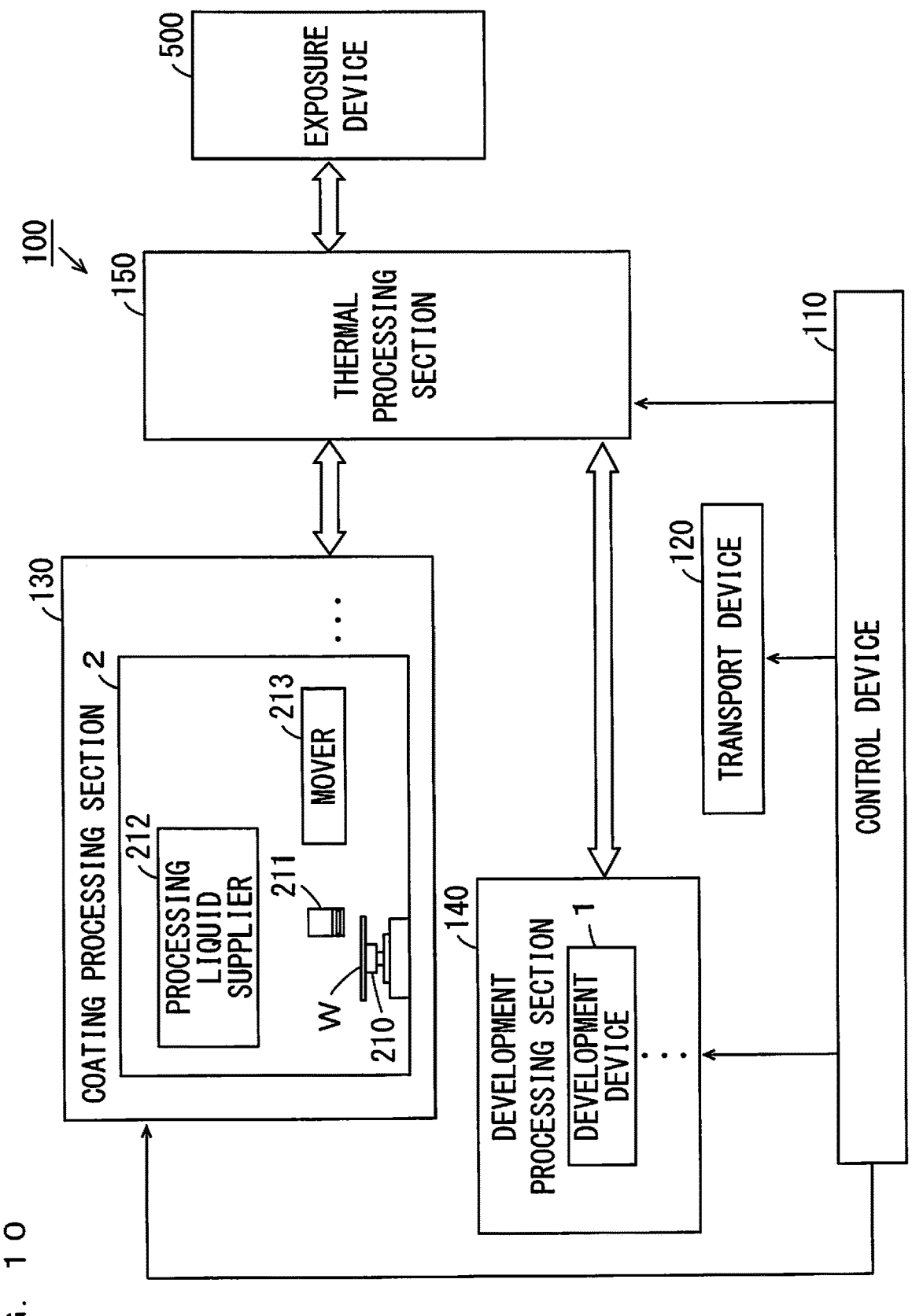
FIG. 10 is a schematic block diagram showing the overall configuration of a substrate processing apparatus including the development device of FIG. 1.

FIG. 10 is a schematic block diagram showing the overall configuration of a substrate processing apparatus including the development device 1 of FIG. 1. As shown in FIG. 10, the substrate processing apparatus 100 is provided to be adjacent to an exposure device (exposer) 500 and includes a control device (controller) 110, a transport device (transporter) 120, a coating processing section 130, a development processing section 140 and a thermal processing section 150.

The control device 110 includes a CPU and a memory, or a microcomputer, for example, and controls operations of the transport device 120, the coating processing section 130, the development processing section 140 and the thermal processing section 150. The transport device 120 transports the substrate W from and to the coating processing section 130, the development processing section 140, the thermal processing section 150 and the exposure device 500.

The coating processing section 130 includes a plurality of coating devices (coaters) 2 as another example of the liquid processing apparatus. In each coating device 2, coating processing of forming a resist film on the substrate W is performed. Each coating device 2 of the present example basically has the same configuration as that of the above-mentioned development device 1.

Specifically, each coating device 2 includes a spin chuck 210, a processing liquid nozzle 211, a processing liquid supplier 212 and a mover 213. The spin chuck 210 has the same configuration as that of the spin chuck 10 of FIG. 1, for example, and rotates the substrate W about a vertical axis using a motor (not shown) while holding the substrate W in a horizontal attitude by suction. The processing liquid nozzle 211 has the same configuration as that of the development liquid nozzle 19 of FIG. 3 or 9, for example, and discharges a processing liquid for a resist film (a resist liquid) onto the substrate W rotated by the spin chuck 210. The mover 213 includes the guide rail 16, the first driver 17 and the first arm 18 of FIG. 1, for example. Similarly to the above-mentioned examples of FIGS. 6 and 7, the mover 213 moves the processing liquid nozzle 211 in the direction of the reference straight line VB with the resist liquid being supplied onto the reference straight line VB passing through the rotational center of the substrate W and the liquid receiving region RA extending in the direction inclined with respect to the reference straight line VB. The processing liquid supplier 212 supplies the resist liquid to the processing liquid nozzle 211.

With such a configuration, each coating device 2 basically performs the coating processing using the same method as the method used in the above-mentioned development processing. Thus, similarly to the above-mentioned example of the development device 1, an amount of the resist liquid required for the coating processing is reduced, and the period of time required for the coating processing is shortened. The exposure processing is performed in the exposure device 500 on the substrate W on which a resist film is formed in the coating processing.

The development processing section 140 includes a plurality of development devices (developers) 1. Each development device 1 performs the development processing on the substrate W by supplying a development liquid to the substrate W after the exposure processing is performed by the exposure device 500. The thermal processing section 150 performs the thermal processing on the substrate W before or after the coating processing performed by the coating device 2 in the coating processing section 130, the development processing performed by the development processing section 140 and the exposure processing performed by the exposure device 500.

In the substrate processing apparatus 100 of FIG. 10, an amount of the development liquid to be used in the development device 1 is reduced, and the development processing is performed in a short period of time. Further, in the coating device 2, an amount of the resist liquid to be used in the coating device 2 is reduced, and the coating processing is performed in a short period of time. Therefore, a manufacturing cost of the substrate W is reduced.

Further, in the coating processing section 130 of FIG. 10, an anti-reflection film may be formed on the substrate W. In this case, the thermal processing section 150 may perform adhesion reinforcement processing for improving adhesion between the substrate W and the anti-reflection film. Further, in the coating processing section 130, a resist cover film for protecting the resist film may be formed on the substrate W on which the resist film is formed. In these cases, in the coating processing section 130, the coating device that forms an anti-reflection film on the substrate W and the coating device that forms a resist cover film on the substrate W may have the configurations similar to those of the above-mentioned development device 1 and coating device 2, respectively.

[8] Other Embodiments (a) In the development device 1 according to the above-mentioned embodiment, the rinse liquid nozzle 34 may have the same configuration as that of the development liquid nozzle 19. In this case, the amount of the rinse liquid required for the cleaning processing, which is performed after the development processing, can be reduced, and the period of time required for the cleaning processing of the substrate W is shortened. Thus, the efficiency of the substrate processing is improved.

(b) While the rinse liquid nozzle 34 is provided separately from the development liquid nozzle 19 in the development device 1 according to the above-mentioned embodiment, the rinse liquid nozzle 34 and the development liquid nozzle 19 may be integrally provided.

(c) When the development processing is performed, the orientation of the development liquid nozzle 19 is fixed such that the discharge direction of the development liquid is inclined with respect to the upper surface of the substrate W, in the development device 1 according to the above-mentioned embodiment. However, the present invention is not limited to this. When the development processing is performed, the orientation of the development liquid nozzle 19 may be fixed such that the discharge direction of the development liquid is orthogonal to the upper surface of the substrate W.

(d) In the development device 1 according to the above-mentioned embodiment, the liquid receiving region RA moves from the rotational center of the substrate W to the outer peripheral end of the substrate W during the development processing, and then the liquid receiving region RA moves from the outer peripheral end of the substrate W to the rotational center of the substrate W. However, the present invention is not limited to this.

In the development processing, an operation of the development liquid nozzle 19 may be controlled such that the liquid receiving region RA moves only from the rotational center of the substrate W to the outer peripheral end of the substrate W. Alternatively, an operation of the development liquid nozzle 19 may be controlled such that the liquid receiving region RA moves only from the outer peripheral end of the substrate W to the rotational center of the substrate W.

(e) While the above-mentioned embodiment is an example for applying the present invention to the development device 1 and the coating device 2, the present invention is not limited to this. The present invention may be applied to another liquid processing apparatus such as a cleaning device.

[9] Correspondences Between Constituent Elements in Claims and Parts in Preferred Embodiments In the following paragraphs, non-limiting examples of correspondences between various elements recited in the claims below and those described above with respect to various preferred embodiments of the present invention are explained.

In the above-mentioned embodiment, the development device 1 and the coating device 2 are examples of a liquid processing apparatus, the spin chucks 10, 210 are an example of a rotation holder, the discharge port 19a of the development liquid nozzle 19 of FIG. 3 is an example of one discharge port, the plurality of discharge ports 195a, 195b, 195c, 195d, 195e of the development liquid nozzle 19 of FIG. 9 are an example of a plurality of discharge ports, the one end of the liquid receiving region RA is an example of a first end of the liquid receiving region, and the other end of the liquid receiving region RA is an example of a second end of the liquid receiving region.

Further, the development liquid nozzle 19 of FIGS. 3 and 9 and the processing liquid nozzle 211 of FIG. 10 are examples of a nozzle, the development liquid supplier 81 of FIG. 2 and the processing liquid supplier 212 of FIG. 10 are examples of a processing liquid supplier, the reference straight line VB is an example of a straight line on the upper surface of the substrate, the guide rail 16, the first driver 17 and the first arm 18 of FIG. 1, and the mover 213 of FIG. 10 are examples of a mover.

As each of constituent elements recited in the claims, various other elements having configurations or functions described in the claims can be also used.

While preferred embodiments of the present invention have been described above, it is to be understood that variations and modifications will be apparent to those skilled in the art without departing the scope and spirit of the present invention. The scope of the present invention, therefore, is to be determined solely by the following claims.

I claim:

1. A liquid processing apparatus that performs predetermined processing by supplying a processing liquid to a substrate, comprising:
   a rotation holder that holds the substrate in a horizontal attitude and rotates the substrate about a vertical axis;
   a nozzle that has one discharge port extending continuously in one direction and discharges a processing liquid to an upper surface of the substrate rotated by the rotation holder;
   a processing liquid supplier that supplies the processing liquid to the nozzle; and
   a mover that moves the nozzle in a direction of a straight line with part of the processing liquid discharged from the nozzle being supplied onto the straight line on the upper surface of the substrate and with a liquid receiving region that receives the processing liquid on the upper surface of the substrate extending in a direction inclined with respect to the straight line, the straight line passing through a rotational center of the substrate rotated by the rotation holder, wherein
   the liquid receiving region has first and second ends, and the second end is located farther away from the rotational center of the substrate than the first end, and is located farther downstream than the first end in a rotation direction of the substrate, and
   the mover moves the nozzle such that the liquid receiving region linearly moves across a portion from the rotational center of the substrate to an outer peripheral end of the substrate.

2. The liquid processing apparatus according to claim 1, wherein
   the mover moves the nozzle with the one discharge port being spaced apart from the straight line in a plan view and with the processing liquid being discharged downstream in the rotation direction of the substrate from the one discharge port.

3. The liquid processing apparatus according to claim 1, wherein
   the one discharge port is a slit formed to extend continuously in the one direction.

4. The liquid processing apparatus according to claim 1, wherein
   the mover moves the nozzle such that the liquid receiving region moves from the rotational center of the substrate to an outer peripheral end of the substrate.

5. The liquid processing apparatus according to claim 4, wherein
   the mover moves the nozzle such that the liquid receiving region moves to the outer peripheral end of the substrate, and then moves the nozzle such that the liquid receiving region returns to the rotational center of the substrate from the outer peripheral end of the substrate.

6. The liquid processing apparatus according to claim 4, wherein
   the mover, when movement of the nozzle is started, positions the nozzle such that the first end of the liquid receiving region is located at the rotational center of the substrate.

7. A liquid processing method for performing predetermined processing by supplying a processing liquid to a substrate, including:
   holding the substrate in a horizontal attitude and rotating the substrate about a vertical axis;
   supplying the processing liquid to a nozzle having one discharge port extending continuously in one direction and discharging the processing liquid from the nozzle to an upper surface of the rotating substrate; and
   moving the nozzle in a direction of a straight line with part of the processing liquid discharged from the nozzle being supplied onto the straight line on the upper surface of the substrate and with a liquid receiving region that receives the processing liquid on the upper surface of the substrate extending in a direction inclined with respect to the straight line, the straight line passing through a rotational center of the rotating substrate, wherein
   the liquid receiving region has first and second ends, and the second end is located farther away from the rotational center of the substrate than the first end and is located farther downstream than the first end in a rotation direction of the substrate, and
   the moving of the nozzle in the direction of the straight line includes moving the nozzle such that the liquid receiving region linearly moves across a portion from the rotational center of the substrate to an outer peripheral end of the substrate.

8. The liquid processing method according to claim 7, wherein
   the moving of the nozzle in the direction of the straight line includes moving the nozzle with the one discharge port being spaced apart from the straight line in a plan view and with the processing liquid being discharged downstream in the rotation direction of the substrate from the one discharge port.

9. The liquid processing method according to claim 7, wherein
   the one discharge port is a slit formed to extend continuously in the one direction.

10. The liquid processing method according to claim 7, wherein
   the moving of the nozzle in the direction of the straight line includes moving the nozzle such that the liquid receiving region moves from the rotational center of the substrate to an outer peripheral end of the substrate.

11. The liquid processing method according to claim 10, wherein
the moving of the nozzle in the direction of the straight line includes moving the nozzle such that the liquid receiving region moves to the outer peripheral end of the substrate, and then moving the nozzle such that the liquid receiving region returns to the rotational center of the substrate from the outer peripheral end of the substrate.

12. The liquid processing method according to claim 10, wherein
the moving of the nozzle in a direction of a straight line, when movement of the nozzle is started, includes positioning the nozzle such that the first end of the liquid receiving region is located at the rotational center of the substrate.

13. A liquid processing apparatus that performs predetermined processing by supplying a processing liquid to a substrate, comprising:
a rotation holder that holds the substrate in a horizontal attitude and rotates the substrate about a vertical axis;
a nozzle that has a plurality of discharge ports intermittently arranged in one direction and discharges a processing liquid to an upper surface of the substrate rotated by the rotation holder;
a processing liquid supplier that supplies the processing liquid to the nozzle; and
a mover that moves the nozzle in a direction of a straight line with part of the processing liquid discharged from the nozzle being supplied onto the straight line on the upper surface of the substrate and with a liquid receiving region that receives the processing liquid on the upper surface of the substrate extending in a direction inclined with respect to the straight line, the straight line passing through a rotational center of the substrate rotated by the rotation holder, wherein
the liquid receiving region has first and second ends, and the second end is located farther away from the rotational center of the substrate than the first end, and is located farther downstream than the first end in a rotation direction of the substrate, and
the mover moves the nozzle such that the liquid receiving region linearly moves across a portion from the rotational center of the substrate to an outer peripheral end of the substrate.

14. A liquid processing method for performing predetermined processing by supplying a processing liquid to a substrate, including:
holding the substrate in a horizontal attitude and rotating the substrate about a vertical axis;
supplying the processing liquid to a nozzle having a plurality of discharge ports arranged intermittently in one direction and discharging the processing liquid from the nozzle to an upper surface of the rotating substrate; and
moving the nozzle in a direction of a straight line with part of the processing liquid discharged from the nozzle being supplied onto the straight line on the upper surface of the substrate and with a liquid receiving region that receives the processing liquid on the upper surface of the substrate extending in a direction inclined with respect to the straight line, the straight line passing through a rotational center of the rotating substrate, wherein
the liquid receiving region has first and second ends, and the second end is located farther away from the rotational center of the substrate than the first end and is located farther downstream than the first end in a rotation direction of the substrate, and
the moving of the nozzle in the direction of the straight line includes moving the nozzle such that the liquid receiving region linearly moves across a portion from the rotational center of the substrate to an outer peripheral end of the substrate.

* * * * *